(12) United States Patent
Nishio et al.

(10) Patent No.: US 6,498,103 B2
(45) Date of Patent: Dec. 24, 2002

(54) METHOD FOR MANUFACTURING SOLID-STATE IMAGING DEVICE

(75) Inventors: Rieko Nishio, Kyoto (JP); Takumi Yamaguchi, Kyoto (JP); Toshihiro Kuriyama, Shiga (JP); Hiroyuki Senda, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/903,411

(22) Filed: Jul. 11, 2001

(65) Prior Publication Data

US 2002/0072239 A1 Jun. 13, 2002

(30) Foreign Application Priority Data

Jul. 12, 2000 (JP) ........................................ 2000-211024

(51) Int. Cl.[7] ............................................. H01L 21/311
(52) U.S. Cl. ...................... 438/694; 438/720; 438/723
(58) Field of Search .................. 438/453, 694, 438/720, 723, 724; 257/215, 250, 437

(56) References Cited

U.S. PATENT DOCUMENTS

| 5,434,097 A | * | 7/1995 | Shin et al. | ........... 148/DIG. 114 |
| 5,545,588 A | * | 8/1996 | Yoo | ............................. 438/453 |
| 5,585,653 A | * | 12/1996 | Nakashiba | ................... 257/232 |
| 5,637,891 A | * | 6/1997 | Lee | ............................. 257/215 |
| 6,060,732 A | * | 5/2000 | Murakami et al. | ........... 257/215 |

* cited by examiner

Primary Examiner—Benjamin L. Utech
Assistant Examiner—Kin-Chan Chen
(74) Attorney, Agent, or Firm—Merchant & Gould P.C.

(57) ABSTRACT

A method for manufacturing a solid-state imaging device includes forming a transfer channel portion and a light-receiving portion in a silicon substrate; forming a silicon oxide film on the silicon substrate; forming a silicon nitride film on the silicon oxide film, the silicon nitride film acting as a gate insulating film together with the silicon oxide film above the transfer channel portion and acting as an anti-reflection film above the light-receiving portion; forming a protection film on the silicon nitride film; forming a polysilicon film above the silicon nitride film via the protection film at least above the light-receiving portion; and etching the polysilicon film so as to form a transfer electrode above the transfer channel portion. The etching of the polysilicon film is carried out so that the polysilicon film is removed above the light-receiving portion while the protection portion remains.

17 Claims, 6 Drawing Sheets

(PRIOR ART)

METHOD FOR MANUFACTURING SOLID-STATE IMAGING DEVICE

FIELD OF THE INVENTION

The present invention relates to a method for manufacturing a solid-state imaging device.

BACKGROUND OF THE INVENTION

In recent years, it is common to provide solid-state imaging devices with chargecoupled devices (hereinafter "CCD" will be referred to) used for transferring charge. This solid-state imaging device has a configuration in which a plurality of light-receiving portions are arranged in a matrix, and a charge transfer portion is formed corresponding to each line of the matrix. The charge transfer portion is a CCD in which a transfer channel portion is formed in a silicon substrate and a transfer electrode is formed above the transfer channel portion via a gate insulating film. In such a solid-state imaging device, in order to improve the sensitivity by suppressing the reflection on the surface of the light-receiving portion, it has been proposed to form an anti-reflection film above the light-receiving portion.

Figure 5A:
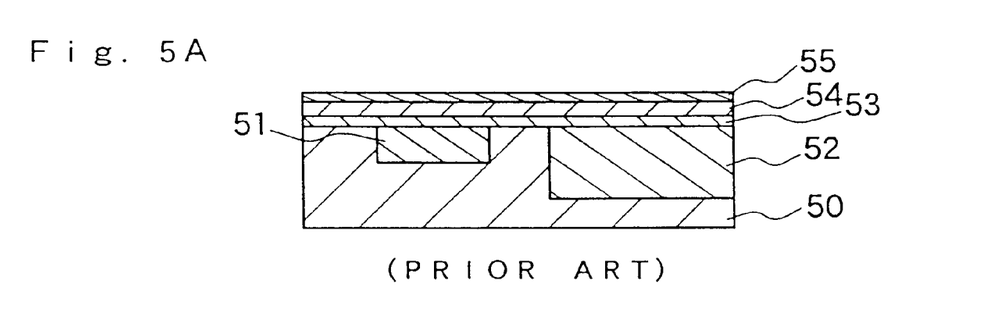
FIGS. 5A to 5C are cross-sectional views to illustrate an example of steps of a method for manufacturing a conventional solid-state imaging device.
Figure 5B:
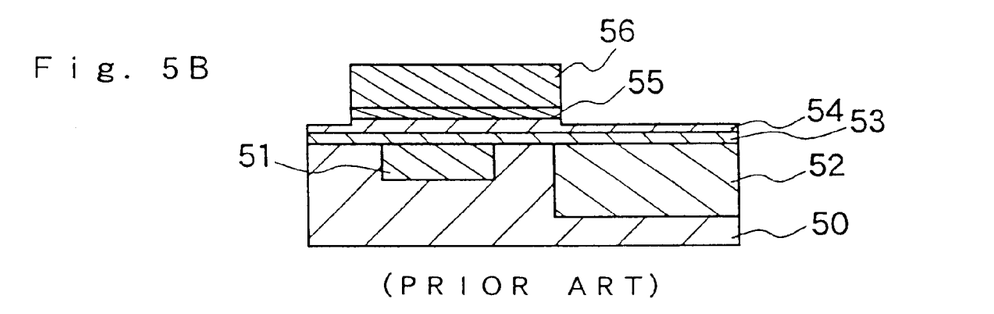
Figure 5C:
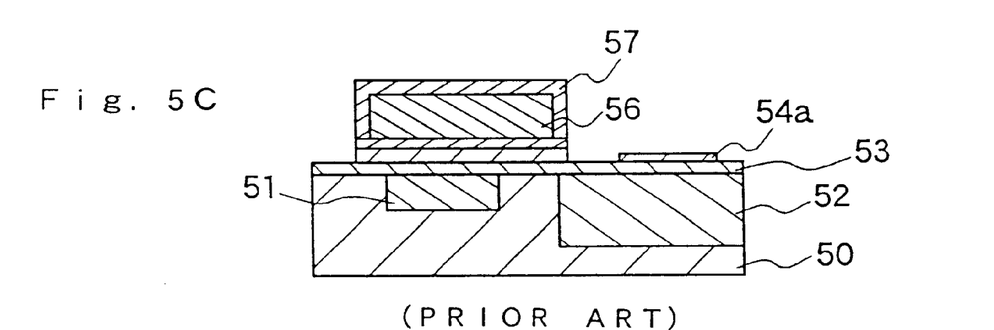

FIGS. 5A to 5C are cross-sectional views to illustrate steps of a method for manufacturing a solid-state imaging device provided with an anti-reflection film. First, on the silicon substrate 50 provided with a light-receiving portion 52 and a transfer channel portion 51, a silicon oxide film 53, a silicon nitride film 54 and a silicon oxide film 55 are formed in this order, thereby forming a three-layered gate insulating film (see FIG. 5A). Then, a polysilicon film is formed, followed by patterning thereof by photolithography and etching, thereby forming a transfer electrode 56 above the transfer channel portion 51 (FIG. 5B). Next, the surface of the transfer electrode 56 is covered with a silicon oxide film 57 by thermal oxidization, followed by patterning of the silicon nitride film 54, thereby forming an anti-reflecting film 54a above the light-receiving portion 52 (FIG. 5C).

FIGS. 6A to 6E are cross-sectional views to illustrate steps of another method for manufacturing a conventional solid-state imaging device. Similar to FIGS. 5A to 5B, on a silicon substrate 60 provided with a light-receiving portion 62 and a transfer channel portion 61, a three-layered gate insulating film including a silicon oxide film 63, a silicon nitride film 64 and a silicon oxide film 65, and a transfer electrode 66 are formed (see FIG. 6A and FIG. 6B). Then, after a silicon oxide film 67 is formed on the surface of the transfer electrode 66, the silicon nitride film 64 above the light-receiving portion 62 is removed (see FIG. 6C). Thereafter, a new silicon nitride film 68 is formed (see FIG. 6D), followed by patterning thereof so as to form an anti-reflecting film 68a above the light-receiving portion 62 (see FIG. 6E).

FIGS. 6A to 6F are cross-sectional views to illustrate steps of another method for manufacturing a conventional solid-state imaging device. Similar to FIGS. 5A to 5B, on a silicon substrate 60 provided with a light-receiving portion 62 and a transfer channel portion 61, a three-layered gate insulating film including a silicon oxide film 63, a silicon nitride film 64 and a silicon oxide film 65, and a transfer electrode 66 are formed (see FIG. 6A and FIG. 6B). Then, after a silicon oxide film 67 is formed on the surface of the transfer electrode 66, the silicon nitride film 64 above the light-receiving portion 62 is removed (see FIG. 6C). Thereafter, a new silicon nitride film 68 is formed (see FIG. 6D), followed by patterning thereof so as to form an anti-reflecting film 68a above the light-receiving portion 62 (see FIG. 6E).

In general, as the etching for forming the transfer electrode, dry etching is carried out. However, in the manufacturing method shown in FIGS. 5A to 5C, when the dry etching is carried out, not only the polysilicon film but also the silicon oxide film 55 and the silicon nitride film 54 above the light-receiving portion 52 are etched (see FIG. 5B). As a result, the film thickness of the silicon nitride film, that is, the anti-reflection film 54a above the light-receiving portion 52 is reduced. Since the anti-reflecting effect is determined by the refractive index and film thickness of the anti-reflection film 54a, if the film thickness of the anti-reflection film 54a is reduced due to the dry etching, the anti-reflecting effect may be deteriorated.

Figure 6A:
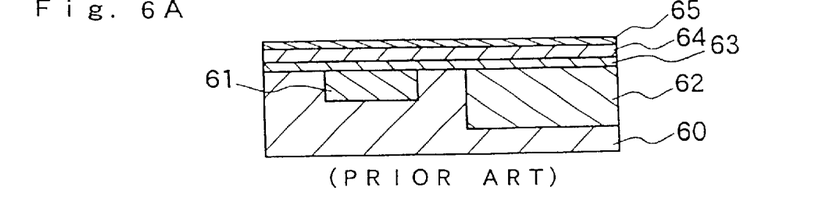
FIGS. 6A to 6E are cross-sectional views to illustrate another example of steps of a method for manufacturing a conventional solid-state imaging device.
Figure 6B:
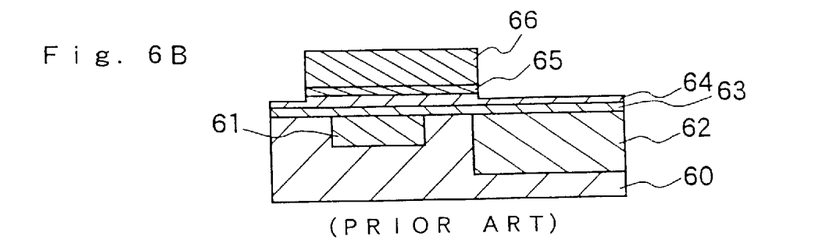
Figure 6C:
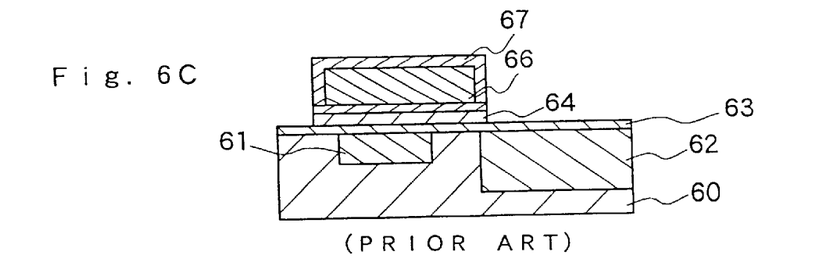
Figure 6D:
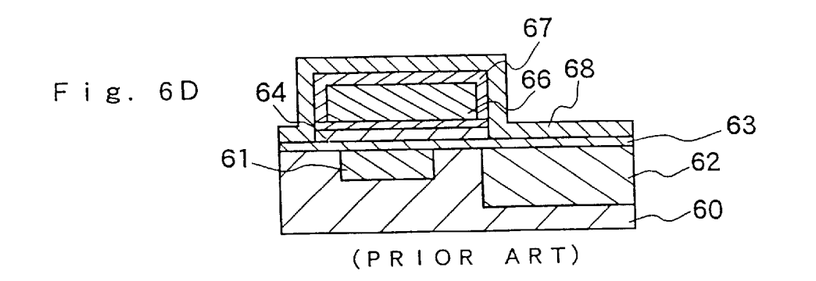
Figure 6E:
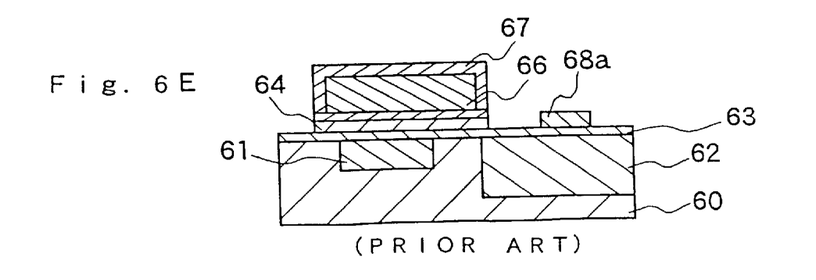

On the other hand, in the manufacturing method shown in FIGS. 6A to 6E, after dry etching for forming the transfer electrode, the silicon nitride film 64 above the light-receiving portion 62 is removed and then the new silicon nitride film is formed as an anti-reflection film (see FIGS. 6C to 6E). Therefore, it is possible to avoid the reduction of the film thickness of the anti-reflection film and to achieve a sufficient anti-reflecting effect. However, since a step of removing the silicon nitride film 64 and a step of forming the new silicon nitride film 68 are required, the number of steps is increased, and the manufacturing efficiency is reduced.

SUMMARY OF THE INVENTION

With the foregoing in mind, it is an object of the present invention to provide a method capable of efficiently manufacturing a solid-state imaging device provided with an anti-reflection film and capable of suppressing the film thickness of the anti-reflection film from being reduced due to the etching.

In order to achieve the above-mentioned objects, a method for manufacturing a solid-state imaging device includes: forming a transfer channel portion and a light-receiving portion in a silicon substrate; forming a silicon oxide film on the silicon substrate; forming a silicon nitride film on the silicon oxide film, the silicon nitride film acting as a gate insulating film together with the silicon oxide film above the transfer channel portion and acting as an anti-reflection film above the light-receiving portion; forming a protection film on the silicon nitride film; forming a polysilicon film above the silicon nitride film via the protection film at least above the light-receiving portion; and etching the polysilicon film so as to form a transfer electrode above the transfer channel portion; wherein the etching of the polysilicon film is carried out so that the polysilicon film is removed above the light-receiving portion while the protection portion remains above the light-receiving portion.

According to such a manufacturing method, since the silicon nitride film constituting the gate insulating film and the silicon nitride film constituting the anti-reflecting film are formed in the same step, a solid-state imaging device provided with an anti-reflection film can be manufactured efficiently. Furthermore, in the etching for forming a transfer electrode, above the light-receiving portion, since the protection film is present on the silicon nitride film, it is possible to suppress the reduction of the film thickness of the silicon nitride film (i.e., anti-reflection film). Therefore, it is possible to form the anti-reflection film having a film thickness serving the anti-reflecting purpose, and to manufacture a solid-state imaging device that is excellent in sensitivity.

In the above-mentioned manufacturing method, it is preferable that the film thickness of the protection film is in the range from 5 nm to 100 nm at least above the light-receiving portion. It is preferable because it is possible to sufficiently suppress the reduction of the film thickness of the anti-reflection film due to the etching for forming the transfer electrode.

Furthermore, in the above-mentioned manufacturing method, it is preferable that the film thickness of the silicon nitride film is in the range from 5 nm to 100 nm at least above the light-receiving portion. It is preferable because a further excellent anti-reflecting effect can be achieved.

Furthermore, in the above-mentioned manufacturing method, it is preferable that the protection film is thinned or removed at least above the transfer channel portion before the polysilicon film is formed. It is preferable because a large transfer capacity can be secured in the charge transfer portion formed of the transfer channel portion and the transfer electrode.

With such a preferable embodiment, it is preferable that the protection film is thinned or removed above the transfer channel portion, and at least above a part between the transfer channel portion and the light-receiving portion. By thinning or removing the protection film in a region between the transfer channel portion and the light-receiving portion, the voltage for reading out the charge from the light-receiving portion to the transfer channel portion can be lowered.

Furthermore, with such a preferable embodiment, it is preferable that the film thickness of the thinned part of the protection film is 1 nm to 50 nm.

Furthermore, with such a preferable embodiment, it is preferable that a new insulating film is formed after the protection film is removed at least above the transfer channel portion before the polysilicon film is formed. In this case, it is preferable that the film thickness of the new insulating film is 1 nm to 50 nm.

In the above-mentioned manufacturing method, it is preferable that the film thickness of the silicon oxide film is allowed to be different between a part above the transfer channel portion and a part above the light-receiving portion before the silicon nitride film is formed. In this case, it is preferable that the film thickness of the silicon oxide film is 1 nm to 80 nm above the transfer channel portion and 1 nm to 100 nm above the light-receiving portion.

The film thickness of the silicon oxide film suitable for the gate insulating film is determined from the viewpoint of securing a sufficient withstand voltage and transfer capacity. On the other hand, from the viewpoint of anti-reflection, the suitable film thickness of the silicon oxide is determined by the relationship between the refractive index of the silicon substrate and the silicon oxide film and light entering the light-receiving portion. Therefore, both of the above-determined film thicknesses are not necessarily the same. However, with such a preferable embodiment, by adjusting the silicon oxide film so as to have the film thickness suitable for the gate insulating film above the transfer channel portion and to have the film thickness serving the anti-reflecting purpose above the light-receiving portion, it is possible to realize the improvement of sensitivity by the anti-reflection more sufficiently while securing a sufficient withstand voltage and transfer capacity in the charge transfer portion.

Furthermore, in the above-mentioned manufacturing method, it is preferable that the film thickness of the silicon nitride film is allowed to be different between a part above the transfer channel portion and a part above the light-receiving portion before the polysilicon film is formed. In this case, it is preferable that the film thickness of the silicon nitride film is 1 nm to 80 nm above the transfer channel portion and 5 nm to 100 nm above the light-receiving portion.

Similar to the above-mentioned silicon oxide film, in the silicon nitride film, the film thickness suitable for the gate insulating film and the film thickness suitable for the anti-reflection film are not necessarily the same. However, with such a preferable embodiment, the silicon nitride film can be adjusted so as to have the film thickness suitable for the gate insulating film above the transfer channel portion and to have the film thickness suitable for the anti-reflection film above the light receiving portion. Thus, it is possible to realize the improvement of the sensitivity by the anti-reflection more sufficiently while securing a sufficient withstand voltage and transfer capacity in the charge transfer portion.

Furthermore, in the above-mentioned manufacturing method, an additional insulating film is formed on the silicon nitride film at least above the light-receiving portion after the silicon nitride film is formed and before the protection film is formed. This additional insulating film works as an anti-reflection film together with the silicon nitride film. For example, a silicon nitride film can be used. Furthermore, the additional insulating film may be a multilayer film.

With such a preferable embodiment, it is easy to obtain the anti-reflection film having a film thickness serving the anti-reflecting purpose. Also, it is possible to realize the improvement of the sensitivity by the anti-reflection effect sufficiently.

In this case, it is preferable that the film thickness of the additional insulating film is allowed to be different between a part above the transfer channel portion and a part above the light-receiving portion before the polysilicon film is formed. At this time, it is preferable that the film thickness of the additional insulating film is 1 nm to 50 nm above the transfer channel portion and 1 nm to 100 nm above the light-receiving portion.

The total film thickness of the silicon nitride film and the additional insulating film formed on the silicon nitride film can be adjusted to the film thickness suitable for the gate insulating film above the transfer channel portion and to the film thickness suitable for the anti-reflection film. Thus, it is possible to realize the improvement of the sensitivity by the anti-reflection more sufficiently while securing a sufficient withstand voltage and transfer capacity in the charge transfer portion.

DESCRIPTION OF THE PREFERRED EMBODIMENTS

First Embodiment

FIGS. 1A to 1E are cross-sectional views to illustrate steps of a method for manufacturing a solid-state imaging device according to the first embodiment of the present invention.

Figure 1A:
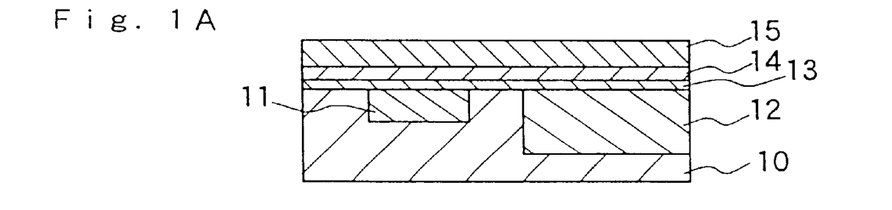
FIGS. 1A to 1E are cross-sectional views to illustrate an example of steps of a method for manufacturing a solid-state imaging device of the present invention.

First, a light-receiving portion 12 and a transfer channel portion 11 are formed in a silicon substrate 10. As the forming method, for example, ion implantation is employed. More specifically, for example, p-type impurities such as boron etc. are ion-implanted in an n-type silicon substrate 10, thereby forming a p-type well. Thereafter, n-type impurities such as phosphorus etc. are ion-implanted in the p-type well, thereby forming a light-receiving portion 12 and the transfer channel portion 11.

Then, a silicon oxide film 13 is formed on the silicon substrate 10. The silicon oxide film 13 may be formed by, for example, a thermal oxidation method. Furthermore, the film thickness of the silicon oxide film 13 is, for example, 1 nm to 100 nm, and preferably 5 nm to 100 nm.

Next, a silicon nitride film 14 is formed on the silicon oxide film 13. As the forming method, for example, a chemical vapor deposition method (which will be referred to as "a CVD method") can be employed. In the finally obtained solid-state imaging device, this silicon nitride film 14 works as a gate insulating film together with the silicon oxide film 13 above the transfer channel portion 11 and works as an anti-reflection film above the light-receiving portion 12.

At this time, the film thickness of the silicon nitride film 14 is adjusted to a thickness serving the anti-reflecting purpose. This film thickness can be determined appropriately in accordance with the refractive index of the silicon nitride film 14 and the wavelength of incident light. More specifically, this film thickness is, for example, 5 nm to 100 nm.

Next, a protection film 15 is formed on the silicon nitride film 14 (see FIG. 1A). As the protection film 15, for example, a silicon oxide film can be used. Furthermore, as the forming method, for example, the CVD method can be employed.

The film thickness of the protection film 15 is adjusted to the film thickness so that the protection film 15 can remain on the light-receiving portion 12 after etching, that is, the downstream process for forming a transfer electrode, is carried out. More specifically, the film thickness is, for example, 5 nm to 100 nm.

Figure 1B:
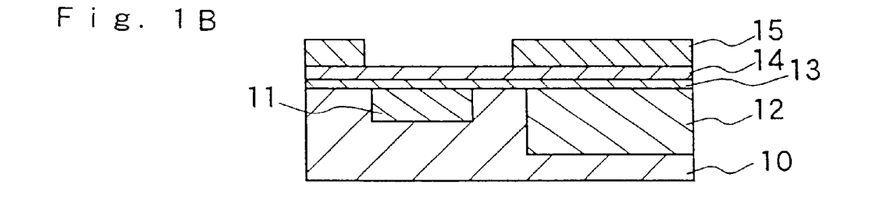

If necessary, the protection film 15 above the transfer channel portion 11 is thinned or removed (see FIG. 1B). In this case, the region in which the protection film 15 is thinned or removed is larger than the transfer channel portion 11. More specifically, the region in which the protection film 15 is thinned or removed reaches the region between the transfer channel portion 11 and the light-receiving portion 12, further to the end of the light-receiving portion 12. Furthermore, the film thickness of the region in which the protection film 15 is thinned can be, for example, 1 nm to 50 nm. Moreover, the method for thinning or removing the film is not particularly limited, and, for example, wet etching using a fluorine-based etchant can-be-employed.

Furthermore, a new silicon oxide film 16 may be formed after the protection film 15 above the transfer channel portion 11 is thinned or removed. In this case, the film thickness of the new silicon oxide film 16 is, for example, 1 nm to 50 nm.

Figure 1C:
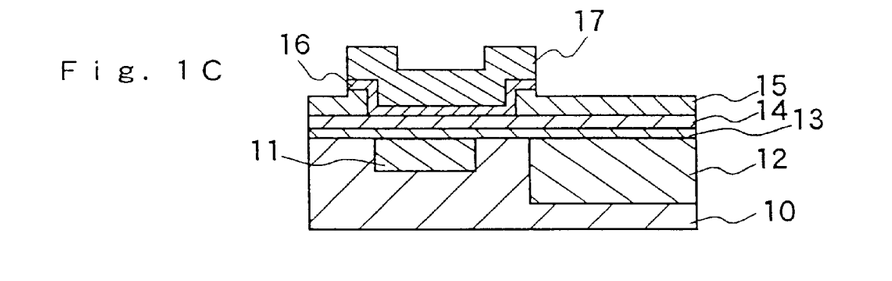

Then, above the silicon nitride film 14, a polysilicon film is formed above at least the light-receiving portion 12 via the protection film 15. As the forming method, for example, the CVD method can be employed.

Patterning of the polysilicon film is carried out by photolithography and etching, thereby forming a transfer electrode 17 above the transfer channel portion 11 (see FIG. 1C). For this etching, for example, dry etching can be employed. Furthermore, this etching is carried out so that the polysilicon film is removed while the protection film 15 remains above the light-receiving portion 12.

In this way, in the above-mentioned etching step, the protection film 15 is present on the silicon nitride film 14 above the light-receiving portion 12. Because this protection film 15 is present, the silicon nitride film 14 above the light-receiving portion 12 is not subjected to etching, thus making it possible to avoid the reduction of the film thickness. As a result, above the light-receiving portion 12, it is possible to secure the film thickness of the silicon nitride film 14 before the protection film is formed, that is, the film thickness of the silicon nitride film 14 serving the anti-reflecting purpose.

Figure 1D:
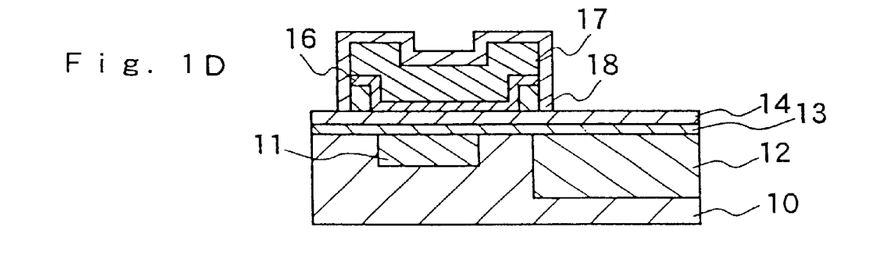
Figure 1E:
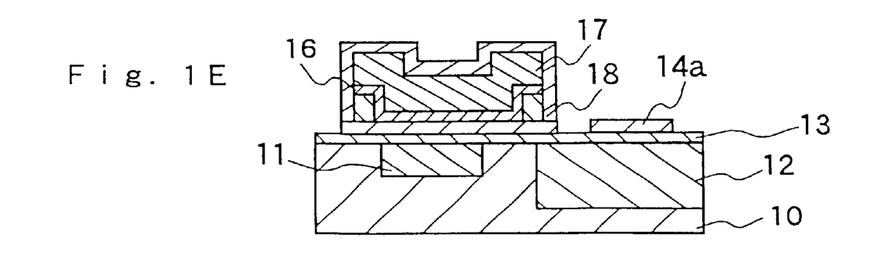

Next, after the protection film 15 remaining on the light-receiving portion 12 is removed, a silicon oxide film 18 is formed on the surface of the transfer electrode 17 by, for example, a thermal oxidation method (see FIG. 1D). Thereafter, patterning of the silicon nitride film 14 is carried out (see FIG. 1E). At this time, the silicon nitride film 14a remaining on the light-receiving portion 12 works as an anti-reflection film. In such a series of steps, a step for forming a flattening film, etc. is added appropriately, and thus a solid-state imaging device is manufactured.

Moreover, in the explanation above, the case where the light-receiving portion 12 and the transfer channel portion 11 are formed before the formation of the silicon oxide film 13 is explained as an example. However, there is no limitation to this in the present invention. For example, the light-receiving portion 12 may be formed after the transfer electrode 17 is formed.

Second Embodiment

FIGS. 2A to 2F are cross-sectional views to illustrate steps of a method for manufacturing a solid-state imaging device according to a second embodiment of the present invention. This embodiment is substantially the same as the first embodiment except that the film thickness of the silicon oxide film is allowed to be different between a part above the light-receiving portion and a part above the transfer channel portion.

Figure 2A:
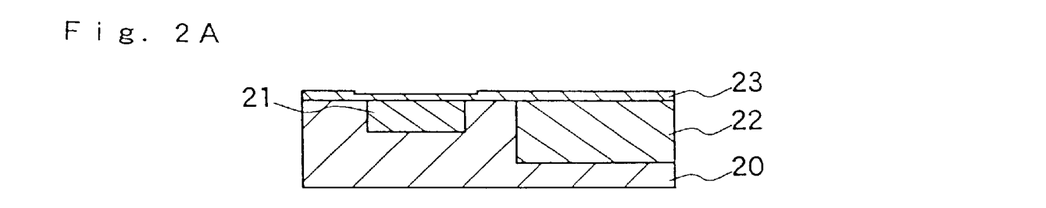
FIGS. 2A to 2F are cross-sectional views to illustrate another example of steps of a method for manufacturing a solid-state imaging device of the present invention.
Figure 2B:
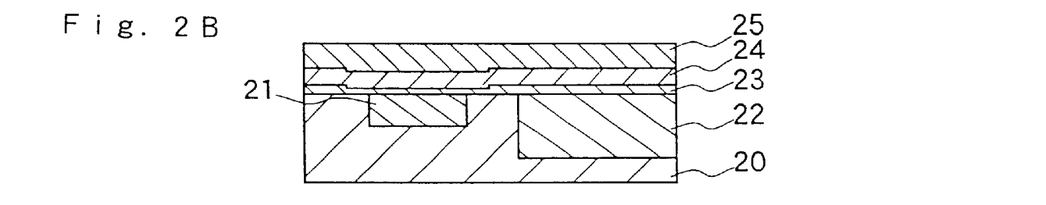

First, a silicon oxide film 23 is formed on a silicon substrate 20 provided with a light-receiving portion 22 and a transfer channel portion 21. The steps so far can be carried out in the same manner as in the first embodiment.

In this embodiment, however, the silicon oxide film 23 at this time is adjusted to the film thickness serving the anti-reflecting purpose. The film thickness is adjusted to, for example, 1 nm to 100 nm, and preferably 5 nm to 100 nm.

Next, above the transfer channel portion 21, the silicon oxide film 23 is thinned (see FIG. 2A). By carrying out this step, the silicon oxide film 23 can be made to be a suitable film thickness so as to work as a gate insulating film above the transfer channel portion 21, and made to be a film thickness so as to be effective in anti-reflection above the light-receiving portion 22.

The method for thinning the film is not particularly limited, and for example, wet etching using a fluorine-based etchant can be employed. Furthermore, the film thickness of the silicon oxide film 23 above the transfer channel portion 21 after the film is thinned can be adjusted to, for example, 1 nm to 80 nm.

Figure 2C:
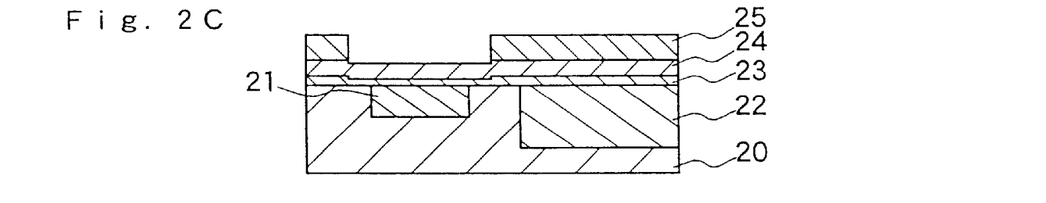
Figure 2D:
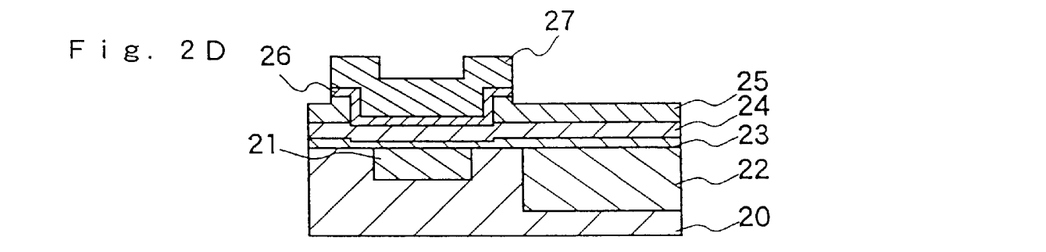
Figure 2E:
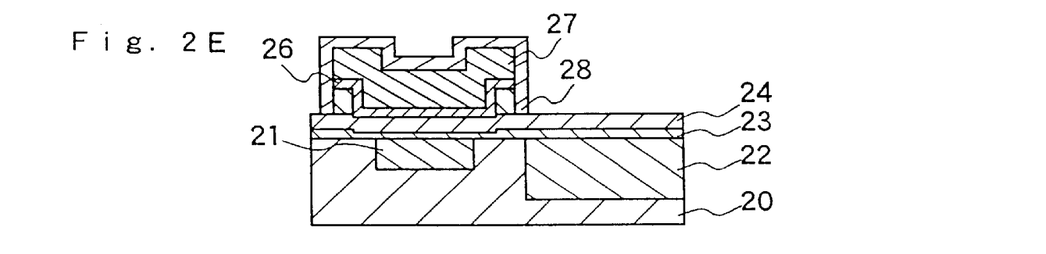
Figure 2F:
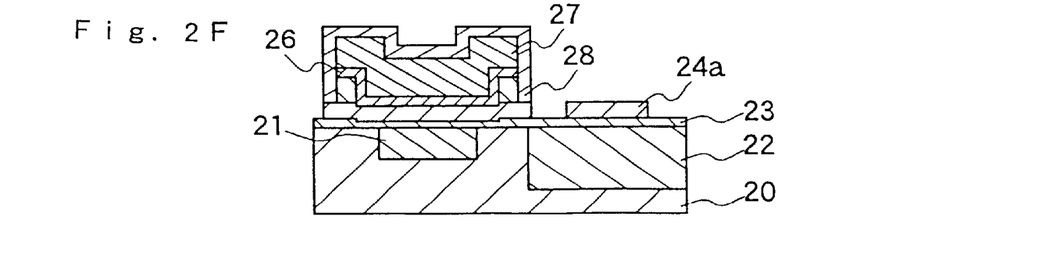

Next, a silicon nitride film 24 and a protection film 25 are formed (see FIG. 2B) and, if necessary, the protection film 25 above the transfer channel portion 21 is removed or thinned (see FIG. 2C). Next, if necessary, the thin silicon oxide film 26 is formed and then a polysilicon film is formed, followed by patterning thereof, thereby forming a transfer electrode 27 (see FIG. 2D). Next, the protection film 25 above the light-receiving portion 22 is removed, and a silicon oxide film 28 is formed (see FIG. 2E), followed by patterning of the silicon nitride film 24, thereby forming an anti-reflection film 24a (see FIG. 2F). These steps can be carried out in the same manner as in the first embodiment.

In the explanation above, as to the thickness of the silicon oxide film 23, the case in which the film thickness suitable for the gate insulating film is smaller than the thickness suitable for the anti-reflection film is explained as an example. On the contrary, in a case where the film thickness suitable for the insulating film is larger than the film thickness suitable for the anti-reflection, in the step of FIG. 2A, after the silicon oxide film 23 is allowed to grow to the film thickness suitable for the gate insulating film, the silicon oxide film 23 above the light-receiving portion 22 instead of the silicon oxide film 23 above the transfer channel portion 21 is thinned.

Furthermore, the same as in the first embodiment, the light-receiving portion 22 and the transfer channel portion 21 are not necessarily formed before the silicon oxide film 23 is formed. For example, the light-receiving portion 22 may be formed after the transfer electrode 27 is formed.

Third Embodiment

FIGS. 3A to 3F are cross-sectional views to illustrate steps of a method for manufacturing a solid-state imaging device according to a third embodiment of the present invention. This embodiment is substantially the same as the first embodiment except that the film thickness of the silicon nitride film is allowed to be different between a part above the light-receiving portion and a part above the transfer channel portion before the polysilicon film is formed.

First, a silicon oxide film 33 and a silicon nitride film 34 are formed on a silicon substrate 30 provided with a light-receiving portion 32 and a transfer channel portion 31. At this time, the film thickness of the silicon nitride film 34 is adjusted to the thickness serving the anti-reflecting purpose. The film thickness is adjusted to, for example, 1 nm to 100 nm, and preferably 5 nm to 100 nm. Then, a protection film 35 is formed (see FIG. 3A). The steps so far can be carried out in the same manner as in the first embodiment.

Figure 3A:
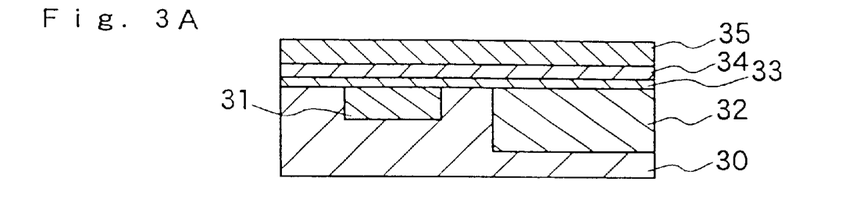
FIGS. 3A to 3F are cross-sectional views to illustrate a further example of steps of a method for manufacturing a solid-state imaging device of the present invention.
Figure 3B:
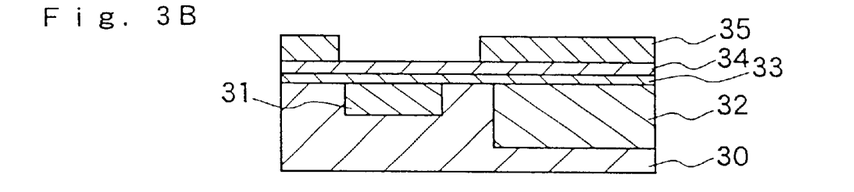

Next, the protection film 35 on the transfer channel portion 31 is removed (see FIG. 3B). In this case, it is preferable that the region in which the protection film 35 is removed is larger than the transfer channel portion 31. Furthermore, as the removing method, for example, wet etching using a fluorine-based etchant can be employed.

Next, the protection film 15 on the transfer channel portion 31 is removed (see FIG. 3B). In this case, it is preferable that the region in which the protection film 15 is removed is larger than the transfer channel portion 11. Furthermore, as the removing method, for example, wet etching using a fluorine-based etchant can be employed.

Figure 3C:
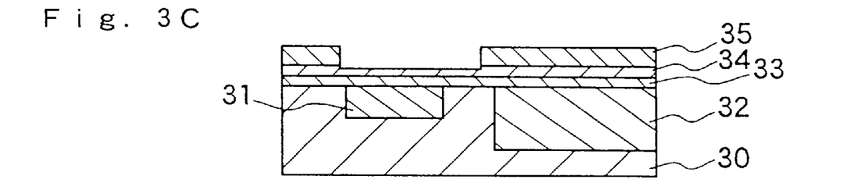

Next, the silicon nitride film 34 above the transfer channel portion 31 is thinned (see FIG. 3C). By carrying out this step, the silicon nitride film 34 can be made to be a suitable film thickness so as to work as a gate insulating film above the transfer channel portion 31, and made to be a suitable film thickness so as to work as an anti-reflection film above the light-receiving portion 32.

The method for thinning a film is not particularly limited, and, for example, wet etching using phosphoric acid can be employed. Furthermore, the film thickness of the silicon nitride film 34 above the transfer channel portion 31, after the film is thinned, is adjusted to, for example, 1 nm to 80 nm.

Figure 3D:
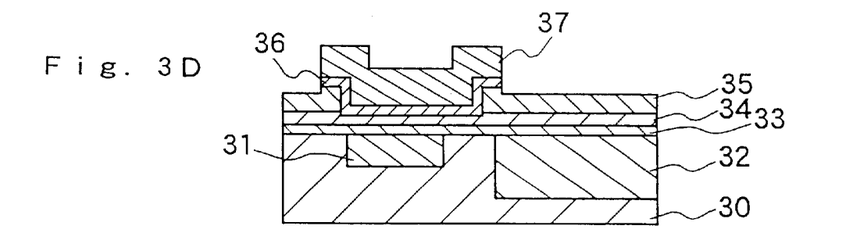
Figure 3E:
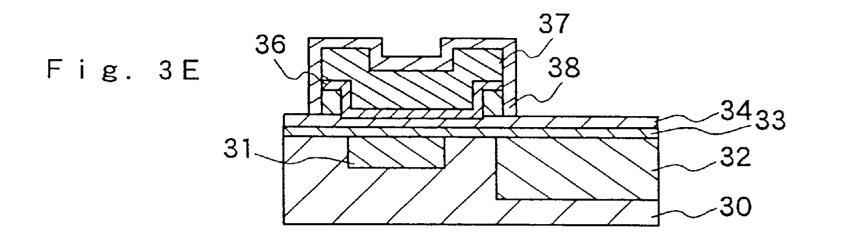
Figure 3F:
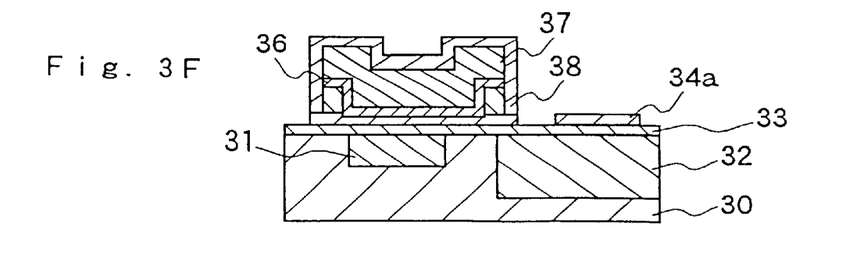

Then, if necessary, a thin silicon oxide film 36 is formed, and then a polysilicon film is formed, followed by patterning thereof, thereby forming a transfer electrode 37 (see FIG. 3D). Furthermore, the protection film 35 above the light-receiving film 32 is removed and the silicon oxide film 38 is formed (see FIG. 3E). Thereafter, the patterning of the silicon nitride film 34 is carried out, thereby forming an anti-reflection film 34a. These steps can be carried out in the same manner as in the first embodiment.

Moreover, in the explanation above, the silicon nitride film 34 is thinned after the protection film 35 is formed. However, the silicon nitride film can be thinned before the protection film 35 is formed.

Furthermore, in the above explanation, as to the thickness of the silicon nitride film 34, the case in which the film thickness suitable for a gate insulating film is smaller than the film thickness suitable for a anti-reflection film is explained as an example. On the contrary, in a case where the film thickness suitable for a gate insulating film is larger than the film thickness suitable for the anti-reflection film, in the step of FIG. 3A, the silicon nitride film 34 is allowed to grow to the film thickness suitable for the gate insulating film, and in the step of FIG. 3C, the silicon nitride film 34 above the light-receiving portion 32 instead of the silicon nitride film 34 above the transfer channel portion 31 is thinned. In this case, however, the step of thinning the silicon nitride film 34 is required to be carried out before the protection film 35 is formed.

Furthermore, similar to the first embodiment, the light-receiving portion 32 and the transfer channel portion 31 are not necessarily formed before the silicon oxide film 33 is formed. For example, the light-receiving portion 32 may be formed after the transfer electrode 37 is formed.

Fourth Embodiment

FIGS. 4A to 4E are cross-sectional views to illustrate steps of a method for manufacturing a solid-state imaging device according to a fourth embodiment of the present invention. This embodiment is substantially the same as the first embodiment except that an additional insulating film is further formed on the silicon nitride film before the protection film is formed.

Figure 4A:
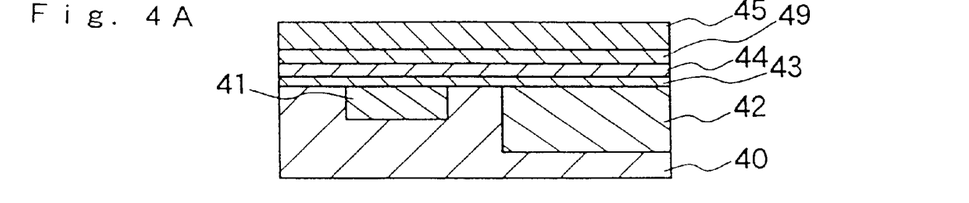
FIGS. 4A to 4E are cross-sectional views to illustrate yet a further example of steps of a method for manufacturing a solid-state imaging device of the present invention.

First, a silicon oxide film 43 and a silicon nitride film 44 are formed on a silicon substrate 40 provided with a light-receiving portion 42 and a transfer channel portion 41. The steps so far can be carried in the same manner as in the first embodiment.

In this embodiment, however, the film thickness of the silicon nitride film 44 at this time is not necessary to be adapted to the film thickness serving the anti-reflecting purpose. The film thickness is adjusted to, for example, 5 nm to 80 nm.

Furthermore, an additional insulating film 49 is formed on the silicon nitride film 44. The additional insulating film 49 works as an anti-reflection film together with the silicon nitride film 44 above the light-receiving portion 42. For example, a silicon nitride film can be used.

Furthermore, as the additional insulating film 49, a multilayer film may be used. In this case, the number of layers of the additional insulating film 49 is not particularly limited. The number is, for example, 2 to 6.

The film thickness of the additional insulating film 49 is adjusted to the thickness so that the total thickness of the additional insulating film 49 and silicon nitride film 44 serves the anti-reflecting purpose. The total film thickness can be determined appropriately in accordance with the refractive index of the silicon nitride film and the additional insulating film, wavelength of the incident light, and the like. More specifically, the film thickness of the additional insulating film 49 is adjusted to, for example, 1 nm to 100 nm.

Moreover, the method for forming the additional insulating film 49 is not particularly limited, and, for example, a CVD method can be employed.

Then, on the additional insulating film 49, a protection film 45 is formed (see FIG. 4A). Thereafter, if necessary, the protection film 45 above the transfer channel portion 41 is thinned or removed. This step can be carried out in the same manner as in the first embodiment.

Figure 4B:
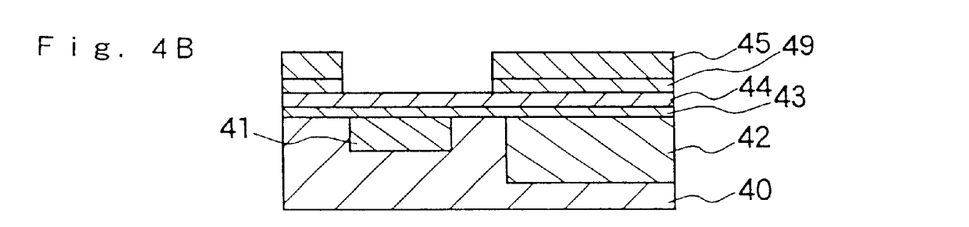

Furthermore, if necessary, the additional insulating film 49 above the transfer channel portion is thinned or removed (see FIG. 4B). The method for thinning or removing the additional insulating film 49 is not particularly limited, but, for example, wet etching using phosphoric acid can be employed.

In this case, the film thickness of the additional insulating film 49, which was thinned, above the transfer channel portion 41 is not particularly limited. However, the film thickness is, for example, 1 nm to 50 nm.

By carrying out this step, the total film thickness of the silicon nitride film 44 and the additional insulating film 49 can be the film thickness suitable for working as a gate insulating film above the transfer channel portion 21, and the film thickness suitable for working as an anti-reflection film above the light-receiving portion 42.

Figure 4C:
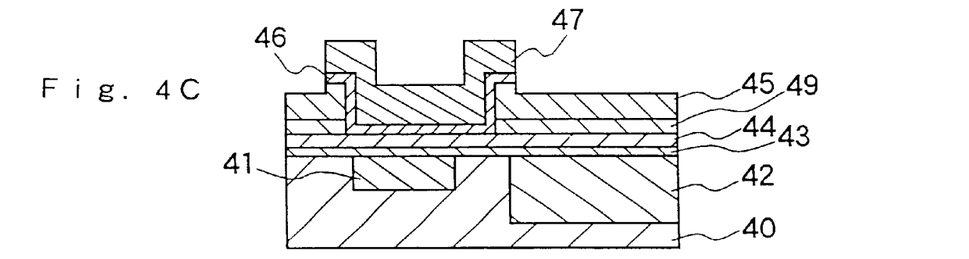
Figure 4D:
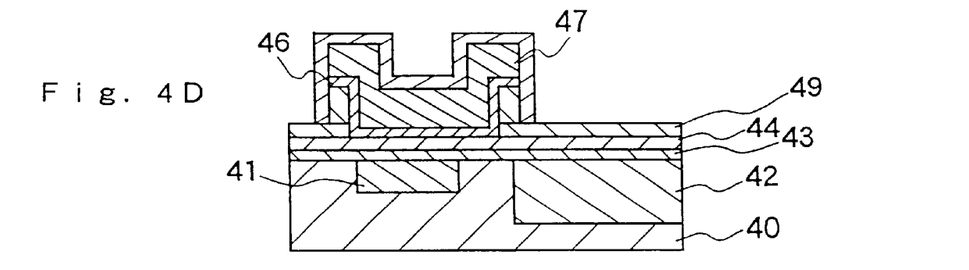
Figure 4E:
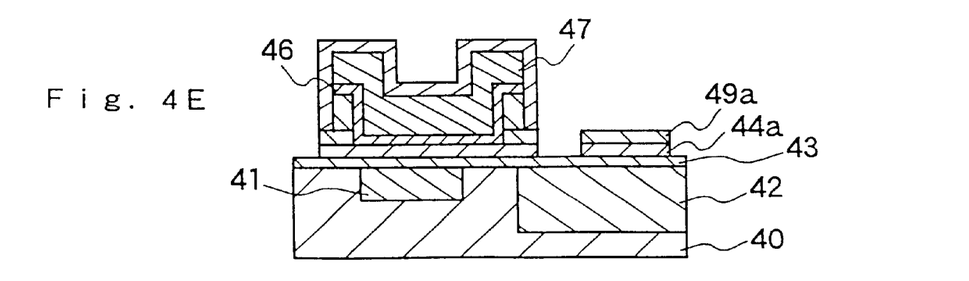

Next, if necessary, a thin silicon oxide film 46 is formed and then a polysilicon film is formed, followed by patterning thereof, thereby forming a transfer electrode 47 (see FIG. 4C). Furthermore, after the protection film 45 above the light-receiving portion 42 is removed, a silicon oxide film 48 is formed (see FIG. 4D), followed by patterning of the silicon nitride film 44 and the additional insulating film 49, thereby forming the anti-reflection film 44a and 49a (see FIG. 4E). These steps can be carried out in the same manner as in the first embodiment.

Moreover, in the explanation above, the additional insulating film 49 is thinned or removed after the protection film 45 is formed. However, the additional insulating film 49 may be thinned or removed before the protection film 45 is formed.

Furthermore, in the explanation above, as to the total film thickness of silicon nitride film 44 and the additional insulating film 49, the case where the film thickness suitable for the gate insulating film is smaller than the film thickness suitable for the anti-reflection film is explained as an example. On the contrary, when the film thickness suitable for the gate insulating film is larger than the film thickness suitable for the anti-reflecting film, in the step of FIG. 4A, the total film thickness of the silicon nitride film 44 and the insulating film 49 is adjusted to the film thickness suitable for the gate insulating film. In the step of FIG. 4B, the additional insulating film 49 above the light-receiving portion 42 instead of the additional insulating film above the transfer channel portion 41 is thinned or removed. In this case, however, the step of thinning the silicon nitride film 49 is required to be thinned or removed before the protection film 45 is formed.

Furthermore, in the case where the additional insulating film 49 has a multilayer structure, besides the method in which the additional insulating film is formed (that is, all the layers constituting the additional insulating film are formed) and then the multilayer is thinned or removed, the method of repeating the steps of forming each layer of additional insulating film and then thinning or removing the layer can be employed.

Furthermore, as in the first embodiment, the light-receiving portion 42 and the transfer channel portion 41 are not necessarily formed before the silicon oxide film 43 is formed. For example, the light-receiving portion 42 may be formed after the transfer electrode 47 is formed.

What is claimed is:

1. A method for manufacturing a solid-state imaging device, the method comprising:

forming a transfer channel portion and a light-receiving portion in a silicon substrate;

forming a silicon oxide film on the silicon substrate;

forming a silicon nitride film on the silicon oxide film, the silicon nitride film acting as a gate insulating film together with the silicon oxide film above the transfer channel portion and acting as an anti-reflection film above the light-receiving portion;

forming a protection film on the silicon nitride film;

forming a polysilicon film above the silicon nitride film via the protection film at least above the light-receiving portion; and etching the polysilicon film so as to form a transfer electrode above the transfer channel portion; wherein the etching of the polysilicon film is carried out so that the polysilicon film is removed above the light-receiving portion while the protection portion remains above the light-receiving portion.

2. The method for manufacturing a solid-state imaging device according to claim 1, wherein the film thickness of the protection film is in the range from 5 nm to 100 nm at least above the light-receiving portion.

3. The method for manufacturing a solid-state imaging device according to claim 1, wherein the film thickness of the silicon nitride film is in the range from 5 nm to 100 nm at least above the light-receiving portion.

4. The method for manufacturing a solid-state imaging device according to claim 1, wherein the protection film is thinned or removed at least above the transfer channel portion before the polysilicon film is formed.

5. The method for manufacturing a solid-state imaging device according to claim 4, wherein the protection film is thinned or removed above the transfer channel portion, and at least above a part between the transfer channel portion and the light-receiving portion.

6. The method for manufacturing a solid-state imaging device according to claim 4, wherein the film thickness of the thinned part of the protection film is 1 nm to 50 nm.

7. The method for manufacturing a solid-state imaging device according to claim 1, wherein a new insulating film is formed after the protection film is removed at least above the transfer channel portion before the polysilicon film is formed.

8. The method for manufacturing a solid-state imaging device according to claim 7, wherein the film thickness of the new insulating film is 1 nm to 50 nm.

9. The method for manufacturing a solid-state imaging device according to claim 1, wherein the film thickness of the silicon oxide film is allowed to be different between a part above the transfer channel portion and a part above the light-receiving portion before the silicon nitride film is formed.

10. The method for manufacturing a solid-state imaging device according to claim 9, wherein the film thickness of the silicon oxide film is 1 nm to 80 nm above the transfer channel portion and 1 nm to 100 nm above the light-receiving portion.

11. The method for manufacturing a solid-state imaging device according to claim 1, wherein the film thickness of the silicon nitride film is allowed to be different between a part above the transfer channel portion and a part above the light-receiving portion before the polysilicon film is formed.

12. The method for manufacturing a solid-state imaging device according to claim 11, wherein the film thickness of the silicon nitride film is 1 nm to 80 nm above the transfer channel portion and 5 nm to 100 nm above the light-receiving portion.

13. The method for manufacturing a solid-state imaging device according to claim 1, wherein an additional insulating film is formed on the silicon nitride film at least above the light-receiving portion after the silicon nitride film is formed and before the protection film is formed.

14. The method for manufacturing a solid-state imaging device according to claim 13, wherein the additional insulating film is a multilayer film.

15. The method for manufacturing a solid-state imaging device according to claim 13, wherein the additional insulating film is a silicon nitride film.

16. The method for manufacturing a solid-state imaging device according to claim 13, wherein the film thickness of the additional insulating film is allowed to be different between a part above the transfer channel portion and a part above the light-receiving portion before the polysilicon film is formed.

17. The method for manufacturing a solid-state imaging device according to claim 16, wherein the film thickness of the additional insulating film is 1 nm to 50 nm above the transfer channel portion and 1 nm to 100 nm above the light-receiving portion.

* * * * *